United States Patent [19]
Casper

[11] Patent Number: 5,831,923
[45] Date of Patent: Nov. 3, 1998

[54] ANTIFUSE DETECT CIRCUIT

[75] Inventor: Stephen L. Casper, Boise, Id.

[73] Assignee: Micron Technology, Inc., Boise, Id.

[21] Appl. No.: 690,856

[22] Filed: Aug. 1, 1996

[51] Int. Cl.[6] .................................................. G11C 7/00
[52] U.S. Cl. ........................................ 365/225.7; 365/96
[58] Field of Search ................... 365/96, 225.7; 327/525, 526

[56] References Cited

U.S. PATENT DOCUMENTS

| | | | |
|---|---|---|---|
| 4,567,387 | 1/1986 | Wacyk | 307/530 |
| 4,621,346 | 11/1986 | McAdams | 365/225.7 |
| 4,937,465 | 6/1990 | Johnson et al. | |
| 5,257,222 | 10/1993 | Lee | 365/96 |
| 5,282,158 | 1/1994 | Lee | 365/96 |
| 5,301,159 | 4/1994 | Lee | 365/225.7 |
| 5,315,177 | 5/1994 | Zagar et al. | 307/465 |
| 5,345,110 | 9/1994 | Renfro . | |
| 5,424,672 | 6/1995 | Cowles et al. | 327/525 |
| 5,491,444 | 2/1996 | McClure | 327/525 |
| 5,566,107 | 10/1996 | Gilliam | 327/525 |
| 5,631,862 | 5/1997 | Cutter | 365/96 |

FOREIGN PATENT DOCUMENTS

0661709   7/1995   European Pat. Off. .......... G11C 7/06

*Primary Examiner*—A. Zarabian
*Attorney, Agent, or Firm*—Schwegman, Lundberg, Woessner & Kluth, P.A.

[57] ABSTRACT

An antifuse detect circuit senses the conductance of a programmable element, such as an antifuse or fuse, and provides a logic output corresponding to the state of the programmable element. A capacitor precharges a comparator input above its input voltage trip point. The programmable element discharges the comparator input below the trip point depending upon its conductance state. The circuit allows quick and accurate sensing of the state of the programmable element, even when it is only marginally conductive, and improves reliability of the programmable element. The programmable element is used in remapping memory cells such as in a dynamic random access memory (DRAM). The state of the programmable element is sensed during precharging of addressing logic, and optionally latched when a row address strobe (RAS) signal is asserted.

35 Claims, 3 Drawing Sheets

ANTIFUSE DETECT CIRCUIT

FIELD OF THE INVENTION

The present invention relates to integrated circuits, and in particular to methods and apparatus for reading the state of an antifuse.

BACKGROUND OF THE INVENTION

Integrated circuits (ICs) often require selectively permanently programmable electrical connections between circuit nodes. Such a connection can be implemented by an antifuse link (antifuse). Antifuses are fabricated with structure similar to that of a capacitor; two conductive electrical terminals are separated by a dielectric layer. An unprogrammed "off" state, in which the antifuse is fabricated, presents a high resistance between the antifuse terminals. The antifuse can also be programmed to an "on" state where a low resistance connection between the antifuse terminals is desired. To program an antifuse "on," a large programming voltage is applied across the antifuse terminals, breaking down the interposed dielectric and forming a conductive link between the antifuse terminals. However, the conductive link between the antifuse terminals is sometimes only marginally conductive, leaving a relatively high resistance of up to approximately 400 KΩ through the antifuse in its marginally "on" state. An even larger voltage could be used to better break down the dielectric, but such a voltage is more likely to cause damage to other circuitry.

Antifuses are often used to permanently store binary data on an IC. Binary logic states are represented by the "on" and "off" states of the antifuse. An antifuse detect circuit may be used to read the state of the antifuse. A typical antifuse detect circuit forms a resistor divider with the antifuse resistance during reading the state of the antifuse element. A marginally "on" antifuse presents a relatively high resistance, which is not well controlled. The resistor divider may only provide a difference on the order of millivolts between a marginally "on" and an "off" antifuse, which is difficult to consistently accurately detect. Thus, a marginally "on" antifuse may erroneously be detected as "off" if the antifuse resistance is sufficiently large.

There is a need in the art to provide a robust antifuse detect circuit for accurate reading of the state of an antifuse, including an antifuse having an only marginally conductive "on" state. For example, antifuses are often used in memory cell arrays such as dynamic random access memories (DRAMs). After testing the DRAM for failing memory cells, failing cell addresses in a DRAM may be remapped to functional cell addresses by selective permanent programming of antifuse elements. This remapping is typically done on a row or column basis. In operating the DRAM, the state of the antifuse must be determined in a timely manner such that memory cells are quickly addressed. A timely and robust antifuse detect circuit is needed for memory cell arrays and for a wide variety of other applications in which antifuse elements may be used.

SUMMARY OF THE INVENTION

A fusible link (fuse) or antifuse sensing circuit uses a precharging element to precharge an input of a comparator. The comparator is coupled to the antifuse element to determine whether it is in a conductive or non-conductive state, corresponding to "on" and "off" conditions, by discharging the precharged comparator input when "on". The use of the precharge element permits more accurate sensing of the intended condition of the antifuse, especially in the case of a marginal "on" condition of an antifuse where the conductivity is not as high as desired. The improved antifuse sensing is particularly useful in dynamic random access memory devices which use such antifuses for memory mapping and permanent data storage. The sensing circuit accurately detects the state of the antifuse within one row address strobe (RAS) cycle.

In one embodiment, the precharging element comprises a capacitor, which is used to capacitively couple a voltage onto the comparator input. The comparator input is decoupled from the positive power supply, eliminating any resistor divider between the antifuse element and the antifuse detect circuit. The resulting voltage at the comparator input is initially more positive than an input voltage trip point of the comparator. A predetermined time is allowed to elapse to bleed the comparator input voltage toward the ground voltage, if the fuse is in a conductive state, rather than toward a voltage determined by resistive division between the antifuse element and the antifuse detect circuit. The length of time is based on an RC time constant of the circuit calculated with a worst case marginally "on" fuse resistance. After the predetermined time, the comparator input voltage is lower than the comparator input voltage trip point if the fuse is in a conductive state. The comparator output provides a logic value corresponding to the state of the fuse. The comparator output is also used to latch the comparator input high if the fuse is in the off condition.

One advantage of the present invention is that the input to the comparator is bled toward ground when the antifuse is marginally "on" as opposed to a voltage determined by a resistive division, which may provide only a difference on the order or millivolts between a marginally "on" antifuse and an "off" antifuse. A further advantage is that the fuse element is not subjected to high currents which may tend to damage a fuse over time.

In a further embodiment, sensing of a fuse is performed at the end of a RAS cycle in a DRAM, when RAS is high. The sensed state, as represented by a logical value is then latched and held for use in the next memory cell access period, which occurs when RAS is low. This provides a much more timely indication of the state of the fuse, allowing more time to address and read memory cells. As the density of such cells increases, and the lines connecting them become longer, quicker addressing is a very important advantage.

DETAILED DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims and their equivalents.

Figure 1:
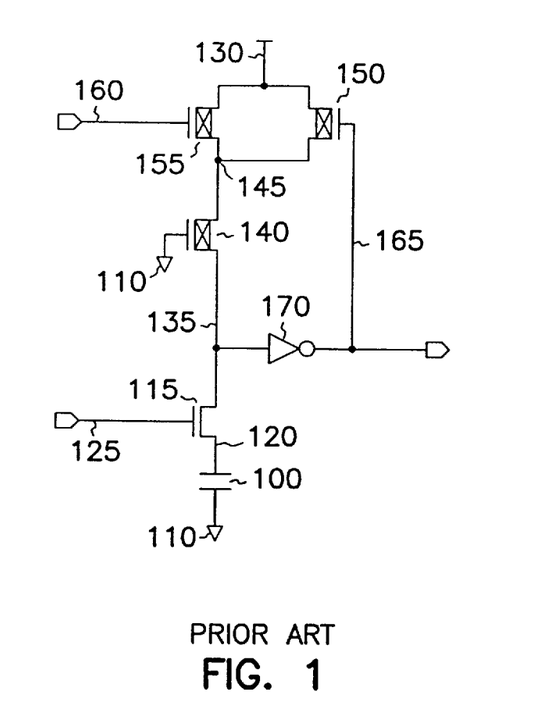
FIG. 1 is schematic diagram illustrating a prior art antifuse detect circuit.

FIG. 1 is a schematic diagram illustrating a prior art antifuse detect circuit. Antifuse 100 has a first terminal coupled to ground node 110 and a second terminal coupled at node 120 to a source terminal of n-channel metal-oxide-semiconductor (NMOS) field-effect transistor (FET) 115. FET 115 has a gate terminal coupled to bias voltage node 125, referred to as DVC2. DVC2 node 125 receives from bias voltage generation circuitry a substantially constant DVC2 bias voltage. This DVC2 bias voltage is approximately equal to one half of a power supply voltage, which is typically referred to as $V_{CC}$, received at $V_{CC}$ node 130. FET 115 has its drain terminal coupled at node 135 to a drain terminal of a p-channel MOS (PMOS) pullup FET 140. A gate terminal of pullup FET 140 is coupled to ground node 110, and a source terminal of PMOS pullup FET 140 is coupled at node 145 to a drain terminal of each of PMOS latching FET 150 and PMOS strobe FET 155. Source terminals of each of latching FET 150 and strobe FET 155 are coupled to $V_{CC}$ node 130. A gate terminal of strobe FET 155 is coupled to control node 160. A gate terminal of latching FET 150 is coupled at output node 165 to an output terminal of inverter 170. An input terminal of inverter 170 is coupled at node 135 to the drain terminals of each of FET 115 and pullup FET 140.

The state of antifuse 100 is detected and provided as a binary logic level at output node 165. At output node 165, a binary logic high ("high") voltage approximately equal to the voltage at $V_{CC}$ node 130 corresponds to antifuse 100 programmed in its "on" state. At output node 165, a binary logic low ("low") voltage approximately equal to the voltage at ground node 110 corresponds to an unprogrammed antifuse 100 remaining in the "off" state in which it is fabricated. To read the state of antifuse 100, strobe FET 155 is turned on by pulsing control node 160 from a voltage approximately equal to that at $V_{CC}$ node 130 to a voltage approximately equal to that at ground node 110 for a short pulse period.

In its "off" state, antifuse 100 presents a high resistance between node 135 and ground node 110. (FET 115 is recognized by one skilled in the art as a resistive protection FET for sufficiently resistively decoupling nodes 135 and 120 so as to inhibit known problems from time-dependent breakdown of an unprogrammed antifuse 100.) During the pulse period, both strobe FET 155 and pullup FET 140 are on, thereby coupling node 135 to $V_{CC}$ node 130 and thereby increasing the voltage at node 135 toward the voltage at $V_{CC}$ node 130. When the voltage at node 135 is increased above an input voltage trip point of inverter 170, the inverter 170 pulls the voltage at output node 165 toward the voltage at ground node 110, thereby turning on latching FET 150, which couples node 135 to $V_{CC}$ node 130 even after strobe FET 155 is turned off. Thus, at output node 165, a binary logic low voltage approximately equal to the voltage at ground node 110 corresponds to unprogrammed antifuse 100 remaining in the "off" state in which it is fabricated.

If antifuse 100 is programmed "on", a conductive path exists between node 120 and ground node 110. In this state, node 135 is coupled to ground node 110 through FET 115 and antifuse 100. Both strobe FET 155 and pullup FET 140 are on during the pulse period, thereby also coupling node 135 to $V_{CC}$ node 130. During the pulse period, the resistance of antifuse 100 forms a resistive divider with the resistances of FET 115, pullup FET 140, and strobe FET 155. The pulse period for turning on strobe FET 155 is short, e.g. 10 nanoseconds, since significant current can be drawn from $V_{CC}$ node 130 during the pulse period when antifuse 100 is programmed "on". Pullup FET 140 is typically a long channel length FET. This ensures that, when antifuse 100 is programmed "on", sufficient resistance exists between nodes 135 and 145 to keep or return the voltage at node 135 below the input voltage trip point of inverter 170 when either of strobe FET 155 or latching FET 150 are on, or when strobe FET 155 and latching FET 150 are both on.

If antifuse 100 is programmed marginally "on" with only a marginally conductive path between node 120 and ground node 110, node 135 is more weakly coupled to ground node 110 through FET 115 and antifuse 100. During the pulse period, both strobe FET 155 and pullup FET 140 are on, thus also coupling node 135 to $V_{CC}$ node 130. During the pulse period, the voltage at node 135 may increase above the input voltage trip point of inverter 150, causing inverter 170 to force the voltage at output node 165 toward that at ground node 110, thus turning on latching FET 150. After the pulse period, latching FET 150 may remain on unless the resistance between node 135 and ground node 110 is sufficiently low to return the voltage at node 135 below that of the input voltage trip point of inverter 170.

During the pulse period, node 135 is coupled both to $V_{CC}$ node 130 and ground node 110, i.e. the voltage at node 135 is determined by resistive division during the pulse period. Thus, if antifuse 100 is programmed marginally "on" with only a marginally conductive path between node 120 and ground node 110, a binary logic low state may erroneously be produced at output node 165.

When antifuse 100 is programmed marginally "on" another drawback becomes evident. Pullup FET 140 is desired to be resistive enough such that the voltage at node 135 is not increased above the input voltage trip point of inverter 135 when antifuse 100 is only marginally conductive. However, a characteristic time constant is formed by the product of a resistance, including the large resistance of pullup FET 140, with the input capacitance of inverter 170. The large resistance of pullup FET 140 increases the time required to pull node 135 high.

Figure 2A:
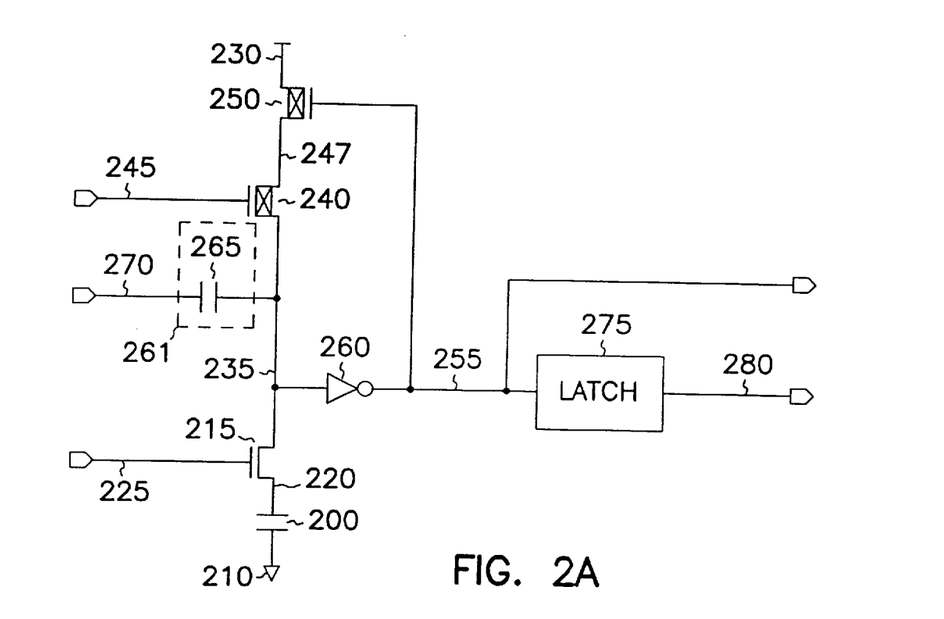
FIG. 2A is a schematic diagram illustrating an antifuse detect circuit of the present invention.

FIG. 2A is a schematic diagram illustrating an antifuses detect circuit of the present invention. Antifuse 200 has a first terminal coupled to ground node 210 and a second terminal coupled at node 220 to a source terminal of NMOS FET 215 which serves as a resistive protection element. FET 215 has a gate terminal coupled to bias voltage node 225, referred to as DVC2. DVC2 node 225 receives from bias voltage generation circuitry a substantially constant DVC2 bias voltage. This DVC2 bias voltage is approximately equal to one half of a power supply voltage, which is typically referred to as $V_{CC}$, received at $V_{CC}$ node 230.

FET 215 has its drain terminal coupled at node 235 to a drain terminal of a PMOS disable FET 240. A gate or control terminal of disable FET 240 is coupled to node 245 and receives a disable control signal at node 245. The disable control signal at node 245 controls operation of disable FET 240 as a switch for substantially electrically isolating node 235 except through antifuse 200. A source terminal of disable FET 240 is coupled at node 247 to a drain terminal of latching FET 250. A source terminal of latching FET 250 is coupled to $V_{CC}$ node 230. A gate or control terminal of latching FET 250 is coupled at output node 255 to an output terminal of inverter 260 to operate latching FET 250 as a switch to control current flow between its conducting source and drain terminals. An input terminal of inverter 260 is couple at node 235 to the drain terminals of each of FET 215 and disable FET 240. A precharger 261 comprises a precharging capacitor 265 having a first terminal coupled to node 235, and a second terminal coupled to precharge node 270 for receiving a precharging control signal.

In one embodiment, a latch 275 is coupled at its input terminal to output node 255 and provides an output at latched output node 280. Latch 275 is not needed unless subsequent logic circuits require the logic value at output node 255 after it is no longer valid.

Figure 2B:
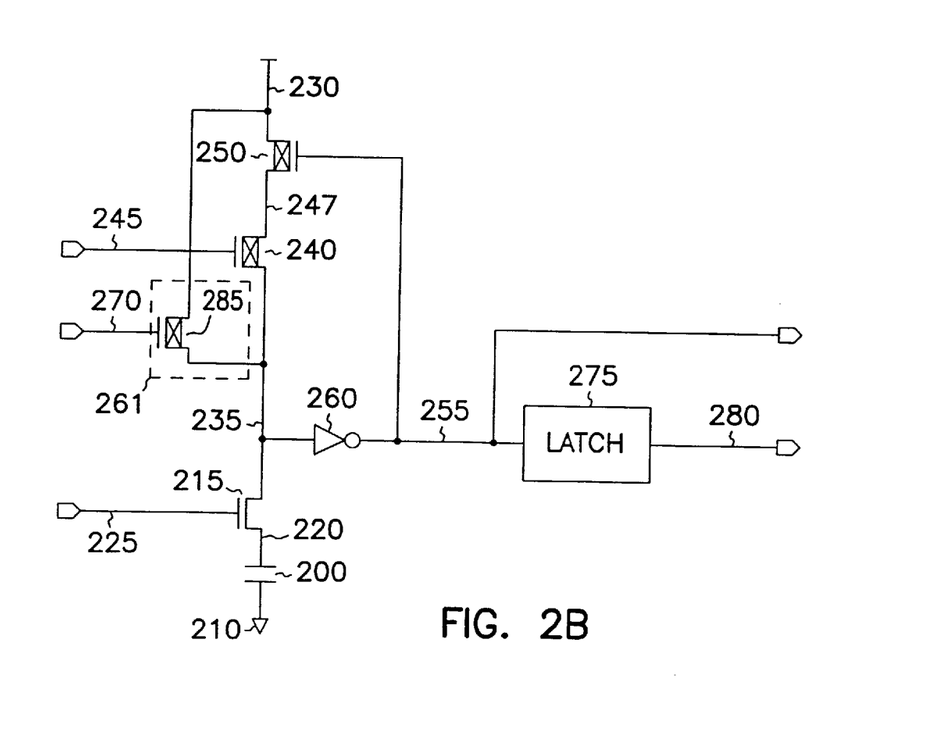
FIG. 2B is a schematic diagram illustrating an alternate embodiment of the antifuse detect circuit of the present invention.

FIG. 2B illustrates an alternate embodiment of the circuit of FIG. 2A in which precharger 261 comprises a switch, such as PMOS precharging FET 285 having a gate terminal coupled to precharge node 270 for receiving a precharging control signal, a source terminal coupled to $V_{CC}$ node 230, and a drain terminal coupled to node 235.

Figure 3A:
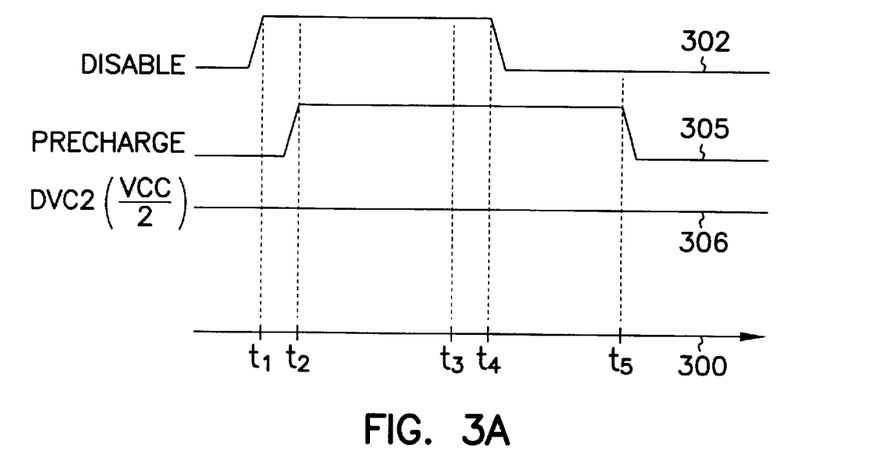
FIG. 3A is a timing diagram illustrating generally several timing relationships within the antifuse detect circuit of FIG. 2A.

FIG. 3A is a timing diagram illustrating generally timing relationships of the antifuse detect circuit of FIG. 2A while the state of antifuse 200 is being read. Increasing time is illustrated generally by axis 300. Disable control signal 302 illustrates generally the voltage at node 245 during reading of antifuse 200 in the embodiment of FIG. 2A having a PMOS disable FET 240. For an NMOS disable FET 240, disable control signal 302 would be inverted from its illustration in FIG. 3A. Precharging control signal 305 illustrates generally the voltage at precharge node 270 during reading of antifuse 200. DVC2 bias voltage signal 306 illustrates generally the bias voltage at DVC2 node 225.

An interval between times $t_1$ and $t_4$ is referred to as a feedback disable pulse period. During the disable pulse period, control circuitry pulses node 245 from a voltage approximately equal to that at ground node 210 to a voltage approximately equal to that at $V_{CC}$ node 230. This turns off disable FET 240 during the disable pulse period such that node 235 is substantially electrically isolated from any dc conducting paths, except through antifuse 200.

An interval between times $t_2$ and $t_5$ is referred to as a precharge pulse period. During the precharge pulse period, control circuitry pulses precharge node 270 from a voltage approximately equal to that at ground node 210 to a more positive voltage approximately equal to that at $V_{CC}$ node 230. Precharge capacitor 265 resists an instantaneous change in voltage across its first and second terminals at node 235 and precharge node 270 respectively. Thus, after time $t_2$, the voltage at node 235 increases from its previous voltage prior to $t_2$. The capacitance value of precharge capacitor 265 is designed to increase the initial voltage after time $t_2$ at node 235 such that it is more positive than the input voltage trip point of inverter 260.

Pulsing precharge node 270 advantageously quickly changes the voltage at node 235. Other precharging techniques may also be used. For example, the voltage at node 235 may also be altered by charging precharge capacitor 265 through a current source at precharge node 270 rather than by the voltage pulse at precharge node 270.

If unprogrammed antifuse 200 is in its "off" state and voltage at node 235 prior to time $t_2$ was, for example, approximately equal to the voltage at $V_{CC}$ node 230, the initial voltage at node 235 after time $t_2$ may exceed the voltage at $V_{CC}$ node 230. In this case, the exact initial voltage at node 235 after time $t_2$ will be determined by capacitive voltage division between precharge capacitor 265 and a lumped capacitance at node 235 excluding that of precharge capacitor 265. The exact initial voltage at node 235 after time $t_2$ may also be limited by any turn on and clamping of a drain-body pn junction diode of PMOS disable FET 240. To avoid CMOS latchup, PMOS disable FET 240 should be surrounded with sufficient diffusion guard rings to collect minority carriers injected into the substrate when the drain-body pn junction of PMOS disable FET 240 is forward biased. Alternatively, disable FET 240 could be implemented as an NMOS FET receiving a gate voltage at node 245 having a binary logic high voltage which is more positive than $V_{CC}$ node 230 by at least its NMOS threshold voltage so as to allow the voltage at node 235 to be pulled up toward $V_{CC}$ when the disable FET 240 is on and antifuse 200 is unprogrammed.

The high resistance presented by unprogrammed antifuse 200 leaves the voltage at node 235 more positive than the input voltage trip point of inverter 260. Inverter 260 pulls output node 255 to a voltage approximately equal to that at ground node 210, thereby turning on latching FET 250. At time $t_4$, disable control signal 302 returns to a voltage approximately equal to that at ground node 210, thereby turning on PMOS disable FET 240. In this state, both disable FET 240 and latching FET 250 are on, thereby coupling node 235 to $V_{CC}$ node 230, and latching output node 255 at a voltage approximately equal to that at ground node 210.

If programmed antifuse 200 is in its "on" state and the voltage at node 235 prior to time $t_2$ was, for example, approximately equal to the voltage at ground node 210, the initial voltage at node 235 after time $t_2$ will become more positive than the voltage at ground node 210. In this case, the exact initial voltage at node 235 after time $t_2$ will be determined by capacitive voltage division between precharge capacitor 265 and a lumped capacitance at node 235 excluding that of precharge capacitor 265. The capacitance value of precharge capacitor 265 is designed to increase the initial voltage after time $t_2$ at node 235, such that it is more positive than the input voltage trip point of inverter 260. After time $t_2$, programmed antifuse 200 and FET 215 couple node 235 to ground node 210, lowering the initial voltage at node 235 toward a voltage at a second supply node, more particularly, toward a voltage at ground node 210.

An interval between times $t_2$ and $t_3$ is referred to as a wait period. The wait period is determined based upon a characteristic time constant formed by a product of a resistance and the lumped capacitance at node 235 including that of precharge capacitor 270. The resistance used in computing the time constant is a sum of the resistance of FET 215 and the maximum allowable resistance of antifuse 200 when it is marginally "on". The wait period defines a sum of the maximum time needed to return the voltage at node 235 below the input voltage trip point of inverter 260 and a short delay time for the inverter 260 to switch the voltage at output node 255. Thus, inverter 260 operates as a comparator.

When antifuse 200 is programmed "on", inverter 260 switches the voltage at output node 255 from approximately the voltage at ground node 210 to approximately the voltage at power supply node 230, thereby turning off latching FET 250. After time $t_3$, the voltage at output node 255 is a valid binary logic value. In one embodiment, the binary logic value at output node 255 is latched by latch 275 after the wait period in order to avoid subsequent logic glitches at output node 255 such as may possibly result when precharge node 270 is returned at time $t_5$ to a voltage approximately equal to that at ground node 210.

Figure 3B:
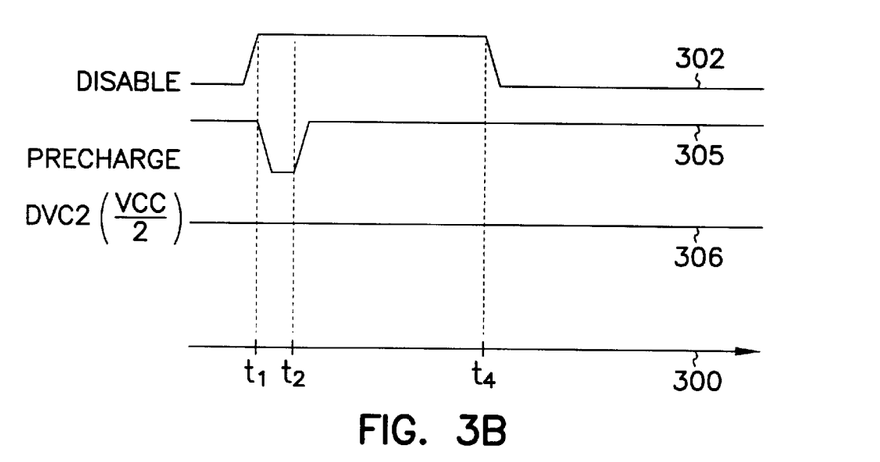
FIG. 3B is a timing diagram illustrating generally several timing relationships within the alternate antifuse detect circuit of FIG. 2B.

FIG. 3B is a timing diagram illustrating generally timing relationships of the antifuse detect circuit of FIG. 2B while the state of antifuse 200 is being read. Since precharging in FIG. 3B is performed by a switch rather than a capacitor, the precharge control signal 305 is pulsed low between $t_1$ and $t_2$ during the disable pulse period. After the precharge control signal returns high and prior to the disable signal returning low, node 235 is substantially electrically isolated from any dc conducting paths, except through antifuse 200. During this period of time, the voltage at node 235 is allowed to be lowered below the input voltage trip point of inverter 260 toward the voltage at ground node 210 if antifuse 200 is programmed "on" or marginally programmed "on".

The antifuse detect circuit of the present invention, as illustrated in FIGS. 2AB–B, offers several advantages over the prior art antifuse detect circuit of FIG. 1. For example, in the present invention node 235 is not coupled to both $V_{CC}$ node 230 and ground node 210 during the feedback disable pulse period. Instead of the resistive divider in the prior art antifuse detect circuit of FIG. 1, node 235 is coupled only to ground node 210 through FET 215 and antifuse 200. Thus, if antifuse 200 is programmed "on" or even if antifuse 200 is only programmed marginally "on", the voltage at node 235 is pulled toward the voltage at ground node 210 rather than toward a resistively divided voltage as in the prior art circuit of FIG. 1. This allows more accurate reading of the state of antifuse 200. Since no direct path exists between $V_{CC}$ node 230 and ground node 210, large current pulses are avoided. This reduces power consumption and may improve the reliability of antifuse 200 with respect to known problems from time dependent breakdown of an unprogrammed antifuse 200.

Figure 4:
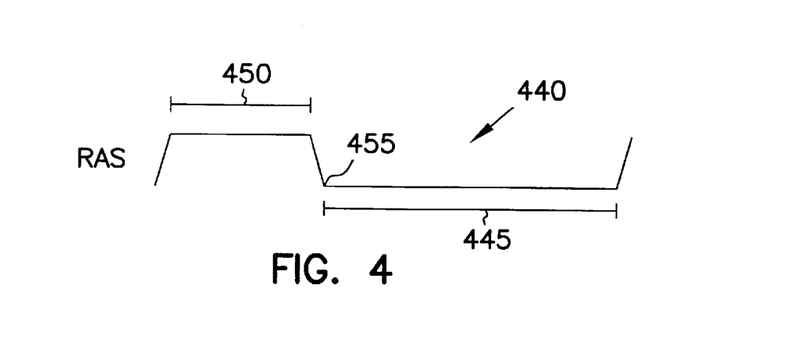
FIG. 4 is a timing diagram illustrating generally the Row Address Strobe (RAS) signal used in addressing dynamic random access memory (DRAM) cells.

The antifuse detect circuits of FIGS. 2A and B are for use in memory cell arrays such as dynamic random access memories (DRAMs). After testing a DRAM for failing memory cells, failing cell addresses in a DRAM are remapped to functional cell addresses by selective permanent programming of at least one antifuse element in row and column decoding logic. Addressing of DRAM memory cells typically includes use of a Row Address Strobe (RAS) signal 440, as illustrated in the timing diagram of FIG. 4. During the time intervals for which RAS 440 is asserted, it is at a low binary logic value (low), referred to as $t_{RAS}$ 445. During $t_{RAS}$ 445, particular rows and columns of the DRAM are addressed. During the time intervals for which RAS 440 is at a high binary logic value (high), referred to as $t_{RP}$ 450, row decoding logic is precharged.

In one embodiment, the feedback disable and precharge pulse periods illustrated in FIGS. 3A and B are executed during the $t_{RP}$ 450 period for which RAS 440 is high. When RAS 440 is initially asserted, as represented in this embodiment as a transition low at time 455, row and column addresses are determined in part from the state of any antifuse 200 element as already detected by the antifuse detect circuits of FIGS. 2A and B. A binary logic value corresponding to the state of the antifuse 200 is provided at each output node 255 and this binary logic value at each output node 255 is optionally latched by any subsequent latch 275 as described above.

In another embodiment, the feedback disable and precharge pulse periods of FIGS. 3A and B are executed during the beginning of the $t_{RAS}$ 445 period, after RAS 440 has transitioned low at time 455. During the $t_{RAS}$ 445 period, row and column addresses are determined in part from the state of antifuse 200 elements as detected by the antifuse detect circuits of FIGS. 2A and B. A binary logic value corresponding to the state of the antifuse 200 is provided at each output node 255 and this binary logic value at each output node 255 is latched by a subsequent latch 275 as described above for sensing of the addressed memory cells during the $t_{RAS}$ 445 period.

Thus, the present invention provides a fast, accurate, and robust antifuse detect circuit capable of quickly reading the state of an antifuse 200 even when it is only marginally programmed "on". The present invention is useful in memory cell arrays and for a wide variety of other applications in which fuse or antifuse elements may be used. The present invention is also useful for reading the state of any other element in which a resistance is to be detected and translated into an output voltage representing a binary logic value.

It should also be noted that in CMOS technology, many times certain areas of the semiconductor die described as having a particular doping, could quite easily be of a different doping, promoting a different type of charge carrier. In such instances, if one were to reverse the primary carriers in all areas of the die and adjust for carrier mobility, the invention would operate in the same manner as described herein without departing from the scope and spirit of the present invention.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A circuit for detecting a conductance state of a resistive element, the circuit comprising:
   a comparator having a comparator input and a comparator output, wherein the comparator input is coupled to the resistive element;
   a first switch having first and second conducting terminals and a control terminal, wherein the control terminal of the first switch is coupled to the comparator output and the first conducting terminal of the first switch is coupled to a supply voltage;
   a second switch having first and second conducting terminals and a control terminal, wherein the first conducting terminal of the second switch is coupled to the second conducting terminal of the first switch, and the second conducting terminal of the second switch is coupled to the comparator input; and
   a precharger coupled to the comparator input when the first switch is electrically isolated from the comparator input by the second switch.

2. The apparatus of claim 1, wherein the precharger comprises a capacitor.

3. The apparatus of claim 1, wherein the precharger comprises a switch.

4. The apparatus of claim 1, wherein the comparator comprises an inverter.

5. The apparatus of claim 1, wherein the resistive element is a programmable antifuse link.

6. The apparatus of claim 1, wherein the resistive element is a fusible link.

7. The apparatus of claim 1, wherein the resistive element is coupled to the comparator input through a resistive protection element.

8. The apparatus of claim 1, wherein the first switch comprises a p-channel metal-oxide-semiconductor (PMOS) latching field effect transistor (FET) for coupling the comparator input to a power supply.

9. The apparatus of claim 1, wherein the second switch comprises a PMOS disable FET for substantially electrically isolating the comparator input from the first switch.

10. A method for detecting a conductance state of a resistive element, the method comprising:
   substantially electrically isolating a comparator input node except through the resistive element;
   precharging the comparator input node to a first logic state;
   determining a resulting logic state at the comparator input node based upon a conductance of the resistive element;
   coupling the comparator input node through a latching switch to a first supply node if the resulting logic state is equivalent to the first logic state;
   coupling the comparator input node through the resistive element to a second supply node if the resulting logic state is different from the first logic state; and
   wherein the step of precharging the comparator input node is carried out before the steps of coupling the comparator input node through a latching switch and coupling the comparator input node through the resistive element.

11. The method of claim 10, wherein the conductance state is detected from an antifuse link.

12. The method of claim 10, wherein the conductance state is detected from a fusible link.

13. The method of claim 10, wherein substantially electrically isolating a comparator input node except through the resistive element comprises substantially electrically isolating the comparator input from the latching switch.

14. The method of claim 10, wherein precharging the comparator input to a first logic state comprises capacitively coupling a voltage to the comparator input.

15. The method of claim 10, wherein determining a resulting logic state at the comparator input node comprises waiting to allow charge to be conducted through the resistive element when it is in a conductive state.

16. The method of claim 10, wherein the state of the resistive element is used to determine an address for a dynamic random access memory cell, and the comparator input is precharged prior to assertion of a Row Address Strobe addressing state signal.

17. A memory system having an array of addressable memory cells, the system comprising:
   a programmable resistive element for remapping a memory cell address; and
   a circuit for detecting a conductance state of the resistive element, the circuit comprising:
      a comparator having a comparator input and a comparator output, wherein the comparator input is coupled to the resistive element,
      a first switch having first and second conducting terminals and a control terminal, wherein the control terminal of the first switch is coupled to the comparator output and the first conducting terminal of the first switch receives a power supply,
      a second switch having first and second conducting terminals and a control terminal, wherein the first conducting terminal of the second switch is coupled to the second conducting terminal of the first switch, and the second conducting terminal of the second switch is coupled to the comparator input, and
      a precharger coupled to the comparator input when the first switch is electrically isolated from the comparator input by the second switch.

18. The system of claim 17, wherein the precharger comprises a capacitor.

19. The system of claim 17, wherein the precharger comprises a switch.

20. The system of claim 17, wherein the memory system comprises a dynamic random access memory (DRAM).

21. The system of claim 17, wherein the memory cells are addressed during an addressing state of a Row Address Strobe (RAS) signal.

22. The system of claim 21, wherein the conductance state of the resistive element is detected while RAS is in a precharging state.

23. The system of claim 22, wherein a binary logic value representing the conductance state of the resistive element is available immediately after RAS leaves the precharging state.

24. The system of claim 21, wherein the conductance state of the resistive element is detected during the addressing state of the RAS signal.

25. A method for remapping memory cell addresses in a dynamic random access memory (DRAM), the method comprising:
   programming a resistive element; and
   detecting a conductance state of the resistive element, the detecting comprising:
      substantially electrically isolating a comparator input node except through the resistive element,
      precharging the comparator input node to a first logic state,
      determining a resulting logic state at the comparator input node based upon a conductance of the resistive element,
      coupling the comparator input node through a latching switch to a first supply node if the resulting logic state is equivalent to the first logic state, and
      coupling the comparator input node through the resistive element to a second supply node if the resulting logic state is different from the first logic state, and
      wherein the step of precharging the comparator input node is carried out before the steps of coupling the comparator input node through a latching switch and coupling the comparator input node through the resistive element.

26. A circuit for detecting a state of a programmable antifuse element, the circuit comprising:
   an inverter having an inverter input and an inverter output, wherein the inverter input is coupled to the antifuse;
   a first field-effect transistor (FET) having drain, gate, and source terminals, wherein the gate terminal of the first FET is coupled to the inverter output and the drain terminal of the first FET is coupled to a power supply;
   a second FET having drain, gate, and source terminals, wherein the drain terminal of the second FET is coupled to the source terminal of the first FET, and the source terminal of the second FET is coupled to the inverter input; and
   a capacitor, coupled to the inverter input, that precharges the inverter input.

27. A circuit for detecting a conductance state of a resistive element, the circuit comprising:
   a comparator having a comparator input and a comparator output, wherein the comparator input is coupled to the resistive element;
   a precharger coupled to the comparator that precharges the comparator input, wherein the percharger comprises a capacitor; and an isolator that selectively substantially electrically isolates the comparator input except from the resistive element for a desired period of time.

28. A circuit for detecting a conductance state of a resistive element, the circuit comprising:

a comparator having a comparator input and a comparator output, wherein the comparator input is coupled to the resistive element;

a first switch having first and second conducting terminals and a control terminal, wherein the control terminal of the first switch is coupled to the comparator output and the first conducting terminal of the first switch is coupled to a supply voltage;

a second switch having first and second conducting terminals and a control terminal, wherein the first conducting terminal of the second switch is coupled to the second conducting terminal of the first switch, and the second conducting terminal of the second switch is coupled to the comparator input; and a precharger, coupled to the comparator input, wherein the precharger comprises a capacitor.

29. The apparatus of claim 28, wherein the first switch comprises a p-channel metal-oxide-semiconductor (PMOS) latching field effect transistor (FET) for coupling the comparator input to a power supply.

30. The apparatus of claim 28, wherein the second switch comprises a PMOS disable FET for substantially electrically isolating the comparator input from the first switch.

31. A method for detecting a conductance state of a resistive element, the method comprising:

substantially electrically isolating a comparator input node except through the resistive element;

precharging the comparator input node to a first logic state by capacitively coupling a voltage to the comparator input;

determining a resulting logic state at the comparator input node based upon a conductance of the resistive element;

coupling the comparator input node through a latching switch to a first supply node if the resulting logic state is equivalent to the first logic state; and coupling the comparator input node through the resistive element to a second supply node if the resulting logic state is different from the first logic state.

32. The method of claim 31, wherein substantially electrically isolating a comparator input node except through the resistive element comprises substantially electrically isolating the comparator input from the latching switch.

33. A memory system having an array of addressable memory cells, the system comprising:

a programmable resistive element for remapping a memory cell address; and a circuit for detecting a conductance state of the resistive element, the circuit comprising:

a comparator having a comparator input and a comparator output, wherein the comparator input is coupled to the resistive element, a first switch having first and second conducting terminals and a control terminal, wherein the control terminal of the first switch is coupled to the comparator output and the first conducting terminal of the first switch receives a power supply, a second switch having first and second conducting terminals and a control terminal, wherein the first conducting terminal of the second switch is coupled to the second conducting terminal of the first switch, and the second conducting terminal of the second switch is coupled to the comparator input, and a precharger, coupled to the comparator input, wherein the precharger comprises a capacitor.

34. A circuit for detecting a conductance state of a resistive element, the circuit comprising:

a comparator having a comparator input and a comparator output, wherein the comparator input is coupled to the resistive element;

a precharger coupled to the comparator that precharges the comparator input, wherein the precharger comprises a capacitor; and an isolator that selectively substantially electrically isolates the comparator input except from the resistive element for a desired period of time.

35. A circuit for detecting a conductance state of a resistive element, the circuit comprising:

an comparator having a comparator input and a comparator output, wherein the comparator input is coupled to the resistive element;

a first switch having first and second conducting terminals and a control terminal, wherein the control terminal of the first switch is coupled to the comparator output and the first conducting terminal of the first switch is coupled to a supply voltage;

a second switch having first and second conducting terminals and a control terminal, wherein the first conducting terminal of the second switch is coupled to the second conducting terminal of the first switch, and the second conducting terminal of the second switch is coupled to the comparator input; and means for precharging the comparator input when the first switch is electrically isolated from the comparator input by the second switch.

* * * * *

UNITED STATES PATENT AND TRADEMARK OFFICE
CERTIFICATE OF CORRECTION

PATENT NO. : 5,831,923

DATED : November 3, 1998

INVENTOR(S) : Stephen L. Casper, Boise, Id.

It is certified that error appears in the above-identified patent and that said Letters Patent is hereby corrected as shown below:

At Col. 2, line 32, please delete "the order or millivolts" and insert -- the order of millivolts --

At Col. 4, line 48, please delete "illustrating an antifuses" and insert -- illustrating an antifuse --

At Col. 7, line 15, please delete "illustrated in FIGS. 2AB-B" and insert
-- illustrated in FIGS. 2A-B --

At Col. 11, line 26, please delete "The apparatus of claim 28," and insert
-- The apparatus of claim 29, --

Signed and Sealed this

Twenty-third Day of May, 2000

Attest:

Q. TODD DICKINSON

*Attesting Officer*          *Director of Patents and Trademarks*

UNITED STATES PATENT AND TRADEMARK OFFICE
CERTIFICATE OF CORRECTION

PATENT NO. : 5,831,923

DATED : November 3, 1998

INVENTOR(S) : Stephen L. Casper

It is certified that error appears in the above-identified patent and that said Letters Patent is hereby corrected as shown below:

At Col. 10, line 66, please delete "percharger" and insert --precharger--, therefor.

Signed and Sealed this

Twenty-fourth Day of October, 2000

*Attest:*

Q. TODD DICKINSON

*Attesting Officer*     *Director of Patents and Trademarks*